United States Patent
Hackl et al.

(10) Patent No.: US 10,340,680 B2
(45) Date of Patent: Jul. 2, 2019

(54) METHOD AND DEVICE FOR SHUTTING DOWN AN INSTALLATION PART EXHIBITING AN INSULATION FAULT IN AN UNGROUNDED POWER SUPPLY SYSTEM

(71) Applicant: Bender GmbH & Co. KG, Gruenberg (DE)

(72) Inventors: Dieter Hackl, Fernwald (DE); Oliver Schaefer, Gruenberg (DE)

(73) Assignee: BENDER GMBH & CO KG, Gruenberg (DE)

( * ) Notice: Subject to any disclaimer, the term of this patent is extended or adjusted under 35 U.S.C. 154(b) by 397 days.

(21) Appl. No.: 15/149,777

(22) Filed: May 9, 2016

(65) Prior Publication Data
US 2016/0336732 A1 Nov. 17, 2016

(30) Foreign Application Priority Data

May 11, 2015 (DE) .................. 10 2015 208 725

(51) Int. Cl.
*H02H 3/16* (2006.01)
*G01R 31/12* (2006.01)
(Continued)

(52) U.S. Cl.
CPC .............. *H02H 3/165* (2013.01); *G01R 31/12* (2013.01); *H02H 3/16* (2013.01); *H02H 7/26* (2013.01); *G01R 27/025* (2013.01)

(58) Field of Classification Search
CPC .... G01R 27/025; G01R 31/02; G01R 31/021; G01R 31/08; G01R 31/12; G01R 31/1272;
(Continued)

(56) References Cited

U.S. PATENT DOCUMENTS

2012/0014020 A1* 1/2012 Lehmann .............. G01R 31/025
 361/42
2012/0126839 A1* 5/2012 Schaefer .............. G01R 27/025
 324/750.01
(Continued)

FOREIGN PATENT DOCUMENTS

CN 102439464 A 5/2012
CN 102933975 A 2/2013
(Continued)

OTHER PUBLICATIONS (Bender Insulation Monitoring in Railroad Applications [online]. Fancos.it [retrieved on Jun. 5, 2001]. Retrieved from the Internet: <URL:http://www.fancos.it/bender_rail.html>.*
(Continued)

*Primary Examiner* — Thienvu V Tran
*Assistant Examiner* — Nicolas Bellido
(74) *Attorney, Agent, or Firm* — King & Schickli, PLLC

(57) ABSTRACT

The invention relates to a method and to a device for shutting down an installation part provided with connected equipment in an ungrounded power supply system in case of an insulation fault in a direct-current circuit connected to the installation part to be shut down. The invention is based on first determining the insulation resistance of the IT power supply system and measuring the displacement direct voltage present in the IT power supply system and then determining by combined evaluation of the measured results if there is a risk of an disruptive influence on the operating behavior of the connected equipment due to the displacement direct voltage occurring during the duration of a predeterminable time interval. If a disruptive influence is to be expected, the installation part exhibiting the insulation fault is immediately shut down together with the direct-current circuit and the equipment connected thereto.

9 Claims, 3 Drawing Sheets

Figure 1:
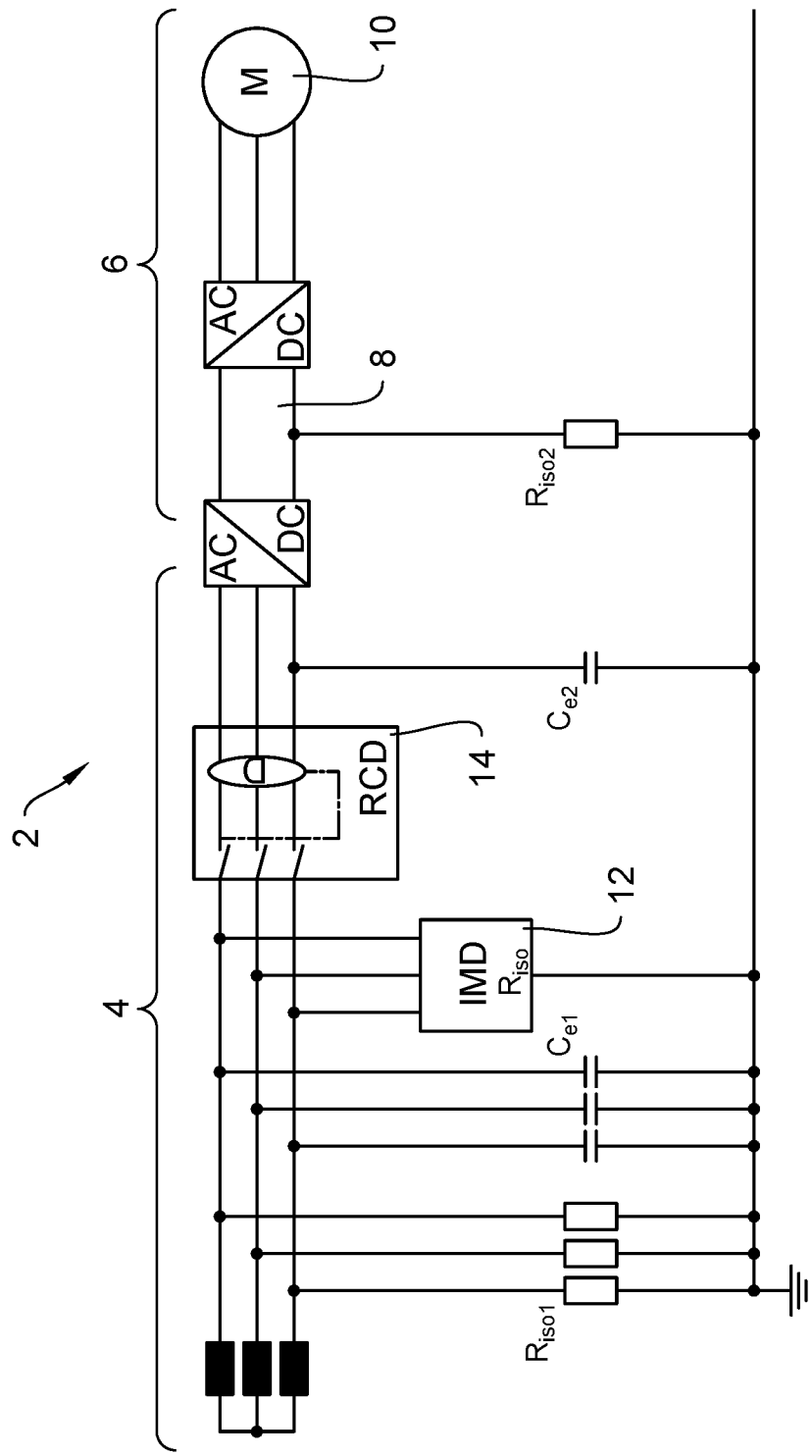

(51) Int. Cl.
*H02H 7/26* (2006.01)
*G01R 27/02* (2006.01)

(58) Field of Classification Search
CPC .. G01R 31/025; G01R 31/026; G01R 31/041;
G01R 31/086; G01R 31/327; H02H
3/027; H02H 3/093; H02H 3/0935; H02H
3/16; H02H 3/165; H02H 3/247; H02H
7/26; H02H 3/33; H02H 5/105
USPC ......... 324/522, 541, 544, 509; 361/89, 91.3,
361/42, 47
See application file for complete search history.

(56) References Cited

U.S. PATENT DOCUMENTS

| | | | | |
|---|---|---|---|---|
| 2013/0082714 A1* | 4/2013 | Moell | ................... | G01R 31/025 324/509 |
| 2013/0082715 A1* | 4/2013 | Kawamura | ............ | G01R 27/18 324/509 |
| 2013/0088240 A1* | 4/2013 | Hofheinz | ............... | G01R 27/18 324/509 |
| 2013/0221997 A1* | 8/2013 | Garcia Alvarrez | ... | B60L 3/0069 324/709 |
| 2013/0328571 A1* | 12/2013 | Schepp | ................... | G01R 27/16 324/551 |
| 2013/0342215 A1* | 12/2013 | Kawamura | .......... | G01R 31/025 324/509 |
| 2015/0204937 A1* | 7/2015 | Lehr | .................... | G01R 31/025 324/551 |
| 2015/0285851 A1* | 10/2015 | Kawamura | ............ | G01R 31/14 324/509 |
| 2016/0315461 A1* | 10/2016 | Pieler | ....................... | H02H 3/20 |

FOREIGN PATENT DOCUMENTS

| | | |
|---|---|---|
| CN | 103389436 A | 2/2013 |
| DE | 2325306 A1 | 11/1974 |

OTHER PUBLICATIONS (Bender Insulation Monitoring in Railroad Applications [online]. Fancos.it [retrieved on Jun. 5, 2001]. Retrieved from the Internet: <URL:http://www.fancos.it/bender_rail.html>. (Year: 2001).*

* cited by examiner

METHOD AND DEVICE FOR SHUTTING DOWN AN INSTALLATION PART EXHIBITING AN INSULATION FAULT IN AN UNGROUNDED POWER SUPPLY SYSTEM

This application claims the benefit of German Patent Application No. 10 2015 208 725.5, filed May 11, 2015, the disclosure of which is incorporated herein by reference.

TECHNICAL FIELD

The invention relates to a method and to a device for shutting down an installation part provided with connected equipment in an ungrounded power supply system in case of an insulation fault in a direct-current circuit connected to the installation part to be shut down.

BACKGROUND

If higher requirements in terms of operational, fire, and contact safety have to be met when supplying electrical equipment with energy, the network type of an ungrounded power supply system is used, which is also known as an insulated network or IT power supply system (French: isolé terre—IT). In this kind of power supply system, the active parts are separated from the ground potential, i.e. against ground. The advantage of these networks is that the function of the electrical equipment is not affected in case of a first insulation fault, such as a fault to ground or a fault to frame, because the ideally infinitely large impedance value prevents a closed circuit from forming between the active conductors of the network (outer conductors and neutral conductor) and ground in this first fault case.

The inherent safety of the IT power supply system thus ensures a continuous power supply of the equipment connected to the IT power supply system, i.e. of the loads fed by the IT power supply system, even if a first insulation fault occurs.

Hence, the resistance of the IT power supply system against ground (insulation resistance, also called insulation fault, insulation fault resistance or fault resistance in the fault case) is continuously monitored according to standard IEC 61557-8 by means of an insulation monitoring device IMD, which is connected between the outer conductors of the IT power supply system and ground, because another potential fault on another active conductor (second fault) would cause a fault loop and the resulting fault current, in connection with an overcurrent protection device, would lead to a shut-down of the installation and to a standstill of operation.

For example, if controlled drive systems are connected to an IT power supply system as equipment or loads, installation parts of the IT power supply system can also comprise a direct-current circuit in addition to the alternating-current feed, such as a DC intermediate circuit of an inverter for supplying power to a three-phase motor. Because of a poor state of insulation of the direct-current circuit, a direct current (DC) may run to ground, which will lead to a displacement direct voltage (displacement DC voltage) between the outer conductor and ground in the IT power supply system. This displacement direct voltage can have a disruptive influence on the operating behavior of the connected load, which, under unfavorable conditions, may cause the load to fail. The fact that displacement direct voltages of this kind can have a negative impact on operating behavior is also apparent from the relevant recommendations and standards (cf., e.g., MIL-STD-1399-300B, section 5.2.12), according to which equipment connected to the IT power supply system can only be subjected to a displacement direct voltage of a certain height without sustaining damage. In connection with a critical displacement direct voltage, even a direct current as low as 100 mA can lead to a malfunction of sensitive control circuits.

To counteract the disruptive influence of the displacement direct voltage on the equipment and to trigger a shutdown of the faulty installation part with the direct-current circuit and the connected equipment, solution approaches are known from the state of the art which try to register the hazardous direct (residual) current with the aid of AC/DC-sensitive differential-current measuring technology.

However, in this case, it must be taken into account at first that, unlike in grounded systems, the reliable function of residual current protection devices (RCDs) in the ungrounded power supply systems considered at hand largely depends on the distribution and size of the present network leakage capacitances. It cannot be ensured in all installations that the functionality of all installed residual current protection devices is checked after slight changes of the IT power supply system, such as after the connection of another load branch.

Moreover, it must be taken into account that leakage currents of up to 20 A (RMS) may occur in extensive 3-phase power supply networks because of the large network leakage capacitances (MIL-STD-1399-300B, section 5.1.2). This means that capacitive leakage currents in the size of 20 A (RMS) have to be tolerated without shutdown while another residual direct current of 100 mA is required to cause a quick shutdown of the faulty installation part causing the direct current.

In view of the requirements regarding shutdown times, the manufacturers and operators of the IT power supply systems use the properties of residual current protection devices as a point of orientation; i.e., the desired shutdown times are in the range of 40 ms to 500 ms.

If one attempts to solve the problem of measuring and detecting the hidden residual direct current by filtering, for example, the expected step response times of the filter are so large that the requirements regarding shutdown times cannot be met.

Practical measurements and verification through simulation further showed that in case of a first insulation fault, displacement direct voltages against ground may occur in a connected driving system whose voltage amplitudes, if short-lived, are not yet operationally hazardous to the driving system and not critical to the loads in the rest of the IT system even after longer exposure, which means that a quick shutdown of the driving system is unwarranted. A premature shutdown in case of a small displacement direct voltage would also excessively reduce the availability of the drive. However, increased stress and early failure of the motor may occur in case of a longer exposure of the driving system to the insulation fault for a period of several seconds or even minutes.

Thus, it is to be noted that the requirements to be met extend far beyond the possibilities of realization offered by differential-current measuring technology known from the state of the art.

SUMMARY

Thus, the object of the present invention is to cause a shut-down of a faulty installation part having a direct-current circuit and equipment connected thereto in case of an insulation fault in the direct-current circuit connected to the ungrounded power supply system in order to allow an operation as reliable as possible of the ungrounded power supply system.

With respect to a method, this object is attained in that the method comprises the following method steps: determining an insulation resistance of the ungrounded power supply system, determining, for all outer conductors of the ungrounded power supply system, a displacement direct voltage between the respective outer conductor and ground, shutting down the system part exhibiting the insulation fault if the obtained insulation-resistance value is smaller than a predeterminable insulation-resistance limit value and the obtained displacement direct voltage is larger than a predeterminable direct-voltage limit value during the duration of a predeterminable time interval.

According to the invention, the basic idea of the present invention is based on first determining the insulation resistance of the IT power supply system and to measure the displacement direct voltage present in the IT power supply system and then determining, by combined evaluation of the measured results, whether the displacement direct voltage obtained for the duration of a predeterminable time interval poses the risk of a disruptive influence on the operating behavior of the connected equipment. If a disruptive influence is to be expected, the installation part exhibiting the insulation fault is immediately shut down together with the direct-current circuit and the equipment connected thereto.

As a shutdown criterion, the obtained displacement direct voltage is assessed based on the determined insulation resistance.

If the level of the insulation-resistance value of the IT power supply system is sufficiently high, even a present displacement direct voltage cannot cause a direct current that would be high enough to have a disruptive influence on the operating state of the connected load.

If there is a first fault case and the insulation-resistance value is smaller than a predeterminable insulation-resistance limit value, in which case an additionally occurring displacement direct voltage could cause a disruption, no shutdown is required as long as no critical displacement direct voltage actually occurs. Now, if a displacement direct voltage larger than a predeterminable direct-voltage limit value actually does occur in this state and persists for a predeterminable time interval, a quick shutdown of the installation part exhibiting the insulation fault is to be triggered.

Thus, according to the philosophy of the IT power supply system, the method according to the invention allows the IT power supply system to continue to operate in case of a first fault as long as the latter is uncritical for the operating state of the connected load, but also takes into account a potentially occurring disruption due to a displacement direct voltage.

With the selective shutdown of the faulty installation part in case of an impending critical operating state due to the displacement direct voltage and with the simultaneous maintenance of the power supply for the fault-free system parts, the IT power supply system operated in this manner exhibits new and advantageous properties in terms of an operation of the ungrounded power supply system that is as reliable and economical as possible.

In a preferred embodiment, the predeterminable direct-voltage limit value with the associated predeterminable time interval is determined as an OR-connection of a first direct-voltage limit value with an associated first time interval and a second direct-voltage limit value with an associated second time interval, the first direct-voltage limit value being higher than the second direct-voltage limit value and the first time interval being shorter than the second time interval.

Thus, two direct-voltage limit value/time interval pairs are formed, which are OR-connected and can be used as a direct-voltage limit value and as a time-interval reference value to assess the disruptive potential of the obtained displacement direct voltage. By means of the first direct-voltage limit value and the first time interval, the disruptive influence due to a high displacement direct voltage is detected, which can cause damage even in case of a brief exposure because of its size. The second direct-voltage limit value with the second time interval takes into account the disruptive influence of a displacement direct voltage that is smaller but occurs for a longer period and thus represents a significantly lower direct-voltage limit value at a significantly slower response behavior—the time interval can be several seconds or even minutes.

As soon as one of the two paired limit-value conditions is met (OR-connection), the installation part exhibiting the insulation fault is shut down.

In another advantageous embodiment, the predeterminable insulation-resistance limit value (Ran), the predeterminable first/second direct-voltage limit value and the predeterminable first/second time interval are set according to the electrical parameters of the connected equipment.

The size of the limit values to be set is primarily determined by the sensitivity or robustness of the connected equipment towards an occurring displacement direct voltage. If the connected load tolerates a relatively high displacement direct voltage, the corresponding direct-voltage limit value can be set to a higher value as compared to a less robust load.

Furthermore, digital filter algorithms and synchronization algorithms are used to determine the insulation resistance and the displacement direct voltage.

Since the insulation monitoring device mandatory according to standard IEC 61557-8 usually feeds an active measuring signal against ground into the IT power supply system, the determination of the displacement direct voltage has to be designed in such a manner that the applied measuring signal does not lead to a shutdown by mistake or to an exceedance of the admissible shutdown times. Furthermore, a displacement alternating voltage (displacement AC voltage) caused by an asymmetrical insulation fault must not negatively affect the determination of the displacement direct voltage, either.

In order to meet these requirements, digital filter algorithms and synchronization algorithms are executed to determine the insulation resistance and the displacement direct voltage, said algorithms allowing a separation of the desired signal components.

In another embodiment, at least a partial insulation resistance of a switched-off installation part having a direct-current circuit is determined, and if it falls short of a partial insulation-resistance limit value, the switched-off installation part is blocked from being connected.

In a situation where the IT power supply system has to meet raised reliability requirements, the partial insulation resistance of an installation part is determined before said installation part is connected. This preferably takes place by means of one or more separate insulation monitoring device (s) (offline IMD) arranged in the installation part.

The offline IMD becomes active only if the installation parts to be monitored are switched off, and it is inactive if the installation parts are actively operated. In case switched-off installation parts are reported to exhibit an insulation fault, the faulty installation part can be blocked from being connected by means of a locking circuit.

In this way, a potential disruptive influence on the fault-free installation parts can be preventatively avoided. Unlike in known solutions using technology measuring differential-currents (RCD), no transient fault currents and no potentially disruptive shutdown spikes are generated in this case.

With respect to a device, the object is further attained in conjunction with the preamble of claim 6 in that the insulation monitoring device comprises a voltage measuring device for determining a displacement direct voltage between a respective outer conductor of the ungrounded power supply system and ground and an evaluating device for combined evaluation of the insulation-resistance value and the displacement direct voltage.

In implementation of the method according to the invention, the device according to the invention comprises an extended insulation monitoring device, which comprises a voltage measuring device for determining the displacement direct voltages and an evaluating device for combined evaluation of the insulation-resistance value and the displacement direct voltage, preferably in one structural unit.

Furthermore, the device can comprise a switching device for shutting down the installation part exhibiting the insulation fault.

The control signal needed to control the switching device is provided by the evaluating device in the extended insulation monitoring device.

In another embodiment, the device comprises one or more separate offline insulation monitoring device(s) (offline IMD) for determining a partial insulation resistance of a switched-off installation part.

The additional monitoring of switched-off installation parts by offline IMDs is in conformity with raised safety and reliability requirements.

In conjunction with the installation of offline IMDs, the insulation monitoring device has a locking circuit, which is connected to the offline IMD(s) via a communication device. A locking logic of this kind prevents a faulty installation part from being connected.

BRIEF DESCRIPTION OF THE DRAWING FIGURES

Figure 2:
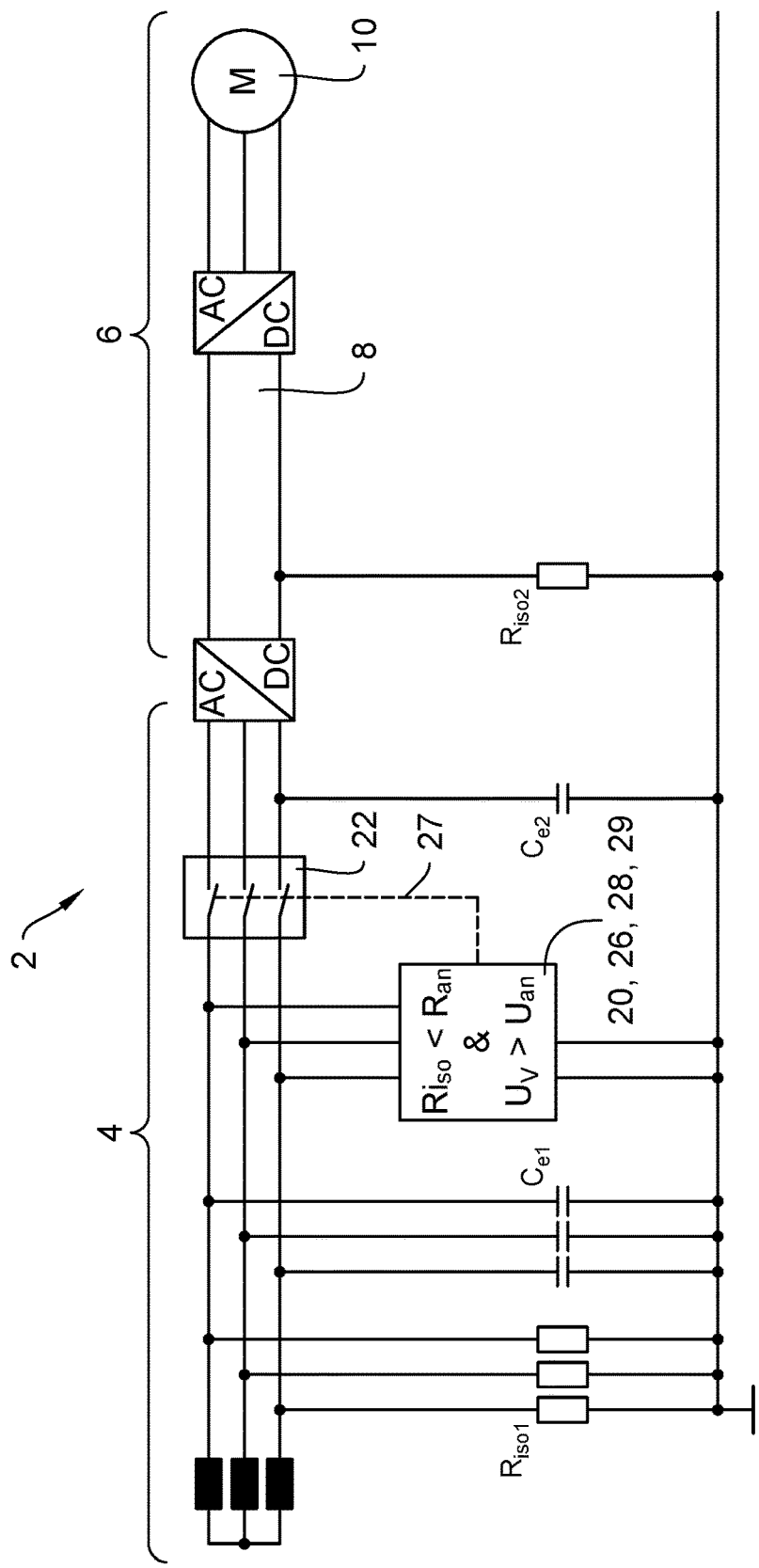
Figure 3:
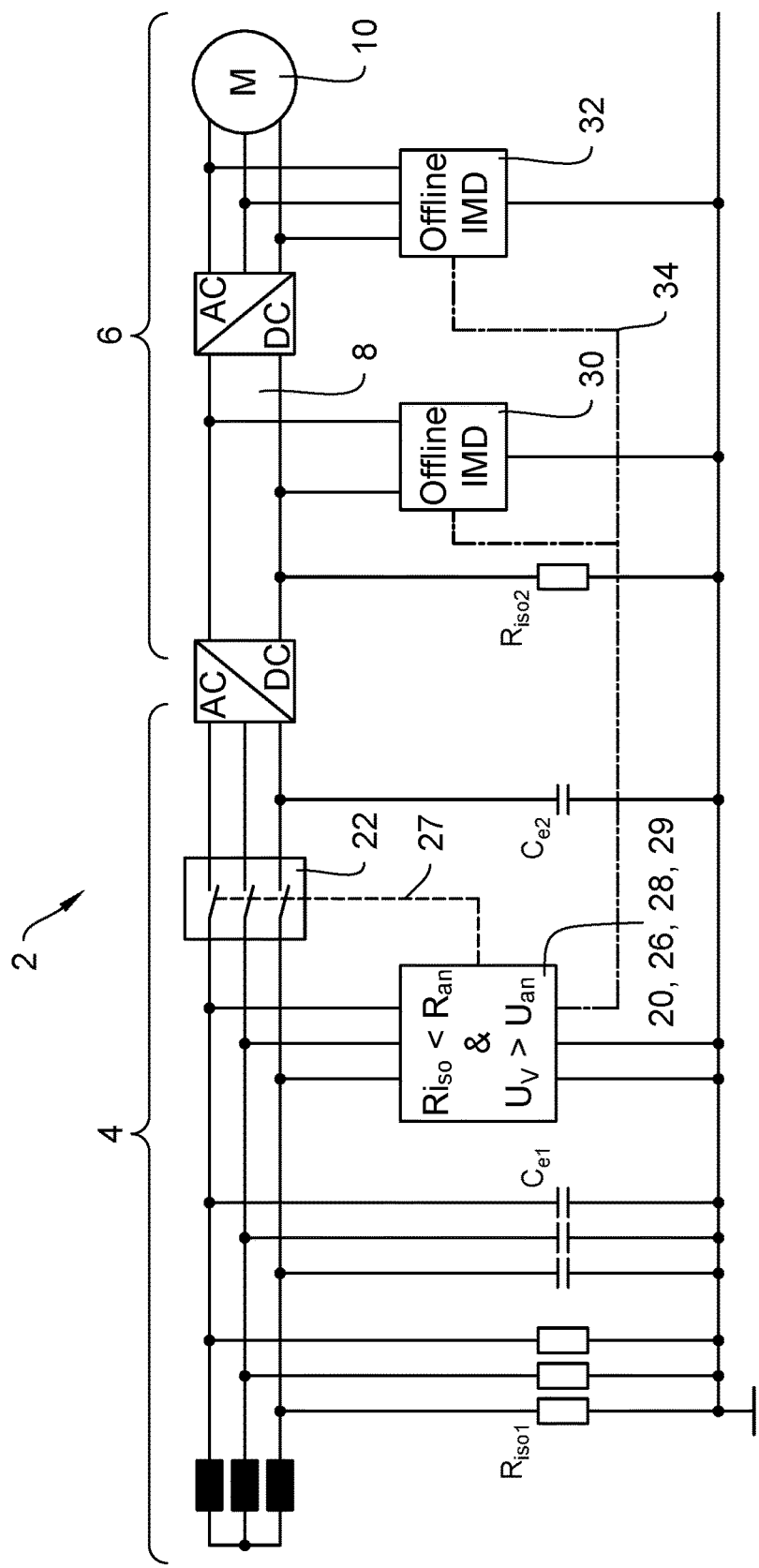

Further understanding of the invention can be gathered from the following description and from the drawing, which illustrates an exemplary implementation of the invention. In the drawing:

FIG. 1: shows an implementation of a method according to the state of the art;

FIG. 2: shows an implementation of a method according to the invention by means of a device according to the invention; and FIG. 3: shows an extended implementation of the method according to the invention.

DETAILED DESCRIPTION

FIG. 1 shows an ungrounded power supply system (IT power supply system) 2 with connected equipment, consisting of a 3-phase alternating current feed 4, to which an installation part 6 is connected, which is capable of being shut down and has a direct-current circuit 8 and a motor as a load, the direct-current circuit 8 and the motor forming a controlled driving system as an example in this case.

A conventional insulation monitoring device 12 for determining the insulation resistance Riso of the entire IT power supply system 2 is arranged in the 3-phase alternating current feed 4. An insulation fault Riso2 occurring in the direct-current circuit 8 causes a residual direct current, which, according to the state of the art, is registered in the residual current protection device 14 by means of differential-current measuring technology. To be able to detect potential disruptive effects on the load 10, the latter should be capable of measuring even a minimal residual direct current in the size of 100 mA. Since a leakage current caused by the leakage capacitance Ce2 also flows through the differential current measuring device, i.e. the measuring current transformer, of the residual current protection device 14 and said capacitive leakage current can develop current strengths of up to 20 A (RMS) especially in extensive networks because of a large leakage capacitance, the differential-current measuring device must be capable of measuring an additional direct current of 100 mA in case of the capacitive leakage current of 20 A (RMS). However, neither the resolution nor the accuracy of the measurement of currently available differential-current measuring technology is sufficient for this purpose.

Another prerequisite for a functioning differential-current measurement in the IT power supply system 2 is that there are return paths running through the measuring current transformer of the residual current protection device 14 for the leakage current flowing by way of the leakage capacitance Ce2 and for the residual current flowing by way of the insulation fault resistance Riso2.

For example, if the insulation resistance Riso1 and the leakage capacitance Ce1 were located downstream of the residual current protection device 14 (seen from the feeding point), the leakage and residual currents in the IT power supply system 2 would continue to flow through Ce2 and Riso2, respectively, but they would not be registered and measured by the residual current protection device 14.

The size of the impedances present in the return path of the measuring current transformer of the residual current protection device 14 thus has a significant impact on the differential-current measuring result and is a source of error.

Thus, if the leakage and residual currents caused by Ce2 and Riso2, respectively, are to be determined, the insulation resistance Riso1 and the leakage capacitance Ce1 in the return path of the measuring current transformer of the residual current protection device 14 must be designed to exhibit low resistance.

These difficulties are avoided by the implementation of the method according to the invention illustrated in FIG. 2. The device according to the invention comprises an extended insulation monitoring device 20 having a voltage measuring device 26 and an evaluating device 28. In addition to the insulation resistance Riso of the IT power supply system 2, the displacement direct voltage Uv caused due to the insulation fault resistance Riso2 is determined by means of the voltage measuring device 26. Taking into account the obtained insulation resistance Riso, i.e. in conjunction with the measured parameters insulation resistance Riso and displacement direct voltage Uv, a check is performed in the evaluating device 28 as to whether there is an operational state critical to the load 10. The installation part 6 exhibiting the insulation fault is shut down together with the direct-current circuit 8 and the load 10 by means of a switching device 22 only if the obtained insulation-resistance value Riso falls short of a predeterminable insulation-resistance limit value Ran and if the displacement direct voltage Uv exceeds a predeterminable direct-voltage limit value Uan. For this purpose, the evaluating device 28 sends a control signal 27 to the switching device 22.

FIG. 3 shows an extended implementation of the method according to the invention. Here, the arrangement illustrated in FIG. 2 is supplemented by two offline IMDs 30, 32 arranged in the installation part 6 capable of being shut down for determining two partial insulation resistances. The offline IMDs 30, 32 are active only if the installation part 6 capable of being shut down is in the switched-off state prior to an intended connection. If at least one partial insulation resistance in the switched-off installation part 6 is assessed to be critical, a connection of the installation part 6 and thus an activation of the load 10 can be prevented by means of a locking circuit 29 in the extended insulation monitoring device 20 and in connection with a communication device 34 between the offline IMDs 30, 32 and the extended insulation monitoring device 20.

The invention claimed is:

1. A method for shutting down an installation part (6) provided with connected equipment in an ungrounded power supply system (2) in case of an insulation fault in a direct-current circuit (8) connected to the installation part (6) to be shut down, comprising the method steps of:
    determining an insulation resistance (Riso) of the ungrounded power supply system (2),
    determining, for all outer conductors of the ungrounded power supply system (2), a displacement direct voltage (Uv) between the respective outer conductor and ground,
    shutting down the installation part (6) exhibiting the insulation fault if the obtained insulation-resistance value (Riso) is smaller than a predeterminable insulation-resistance limit value (Ran) and the obtained displacement direct voltage (Uv) is greater than a predeterminable direct-voltage limit value (Uan) during the duration of a predeterminable time interval (Tan).

2. The method according to claim 1, characterized in that the predeterminable direct-voltage limit value (Uan) with the associated predeterminable time interval (Tan) is determined as an OR-connection of a first direct-voltage limit value with an associated first time interval and a second direct-voltage limit value with an associated second time interval, the first direct-voltage limit value being higher than the second direct-voltage limit value and the first time interval being shorter than the second time interval.

3. The method according to claim 1, characterized in that the predeterminable insulation-resistance limit value (Ran), the predeterminable first/second direct-voltage limit value and the predeterminable first/second time interval are set according to the electrical parameters of the connected equipment.

4. The method according to claim 1, characterized in that digital filter algorithms and synchronization algorithms are used to determine the insulation resistance (Riso) and the displacement direct voltage (Uv).

5. The method according to claim 1, characterized in that at least a partial insulation resistance of a switched-off installation part (6) having a direct-current circuit (8) is determined and the switched-off installation part (6) is blocked from being connected if the partial insulation resistance falls short of a partial insulation-resistance limit value.

6. A device for shutting down an installation part (6) provided with connected equipment in an ungrounded power supply system (2) in case of an insulation fault in a direct-current circuit (8) connected to the installation part (6) to be shut down, comprising an insulation monitoring device (20) for determining an insulation resistance (Riso) of the ungrounded power supply system (2), characterized in that the insulation monitoring device (20) comprises a voltage measuring device (26) for determining a displacement direct voltage (Uv) between a respective outer conductor of the ungrounded power supply system (2) and ground and an evaluating device (28) for combined evaluation of the insulation-resistance value (Riso) and the displacement direct voltage (Uv).

7. The device according to claim 6, characterized by a switching device (22) for shutting down the installation part (6) exhibiting the insulation fault.

8. The device according to claim 6, characterized by a separate offline insulation monitoring device (30, 32) for determining a partial insulation resistance of a switched-off installation part.

9. The device according to claim 8, characterized in that the insulation monitoring device (20) comprises a locking circuit (29) connected to the offline insulation monitoring device (30, 32) via a communication device (34).

* * * * *